(12) United States Patent
Gutala et al.

(10) Patent No.: US 10,964,624 B2
(45) Date of Patent: Mar. 30, 2021

(54) TECHNIQUES FOR FLUID COOLING OF INTEGRATED CIRCUITS IN PACKAGES

(71) Applicant: Intel Corporation, Santa Clara, CA (US)

(72) Inventors: Ravi Gutala, San Jose, CA (US); Aravind Dasu, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 15/416,589

(22) Filed: Jan. 26, 2017

(65) Prior Publication Data
US 2018/0211900 A1 Jul. 26, 2018

(51) Int. Cl.
| | | |
|---|---|---|
| H01L 23/473 | (2006.01) | |
| H01L 25/065 | (2006.01) | |
| G11C 7/04 | (2006.01) | |
| H05K 7/20 | (2006.01) | |
| H01L 23/00 | (2006.01) | |

(52) U.S. Cl.
CPC ............ H01L 23/473 (2013.01); G11C 7/04 (2013.01); H01L 25/0655 (2013.01); H05K 7/20254 (2013.01); H01L 24/17 (2013.01); H01L 2224/16225 (2013.01); H01L 2224/16227 (2013.01); H01L 2924/1436 (2013.01)

(58) Field of Classification Search
CPC .. H05K 7/20254; G11C 7/04; G05D 23/1919; G06F 1/206; H01L 23/473; H01L 25/0655; H01L 24/17; H01L 2224/16225; H01L 2224/16227; H01L 2924/1436
See application file for complete search history.

(56) References Cited

U.S. PATENT DOCUMENTS 2,600,842 A * 6/1952 Buecken ............... B29C 35/007
165/201
7,126,822 B2 10/2006 Hu et al.
(Continued)

FOREIGN PATENT DOCUMENTS

| JP | S3192256 A | * | 8/1988 |
| JP | S63192255 A | * | 8/1988 |

(Continued)

OTHER PUBLICATIONS

Shimonishi, Integrated Circuit Cooling Constitution, Aug. 9, 1988, JPS63192256A, Whole Document.*
Hagiwara, Integrated Circuit Cooling Constitution, Aug. 9, 1988, JPS63192255A, Whole Document (Year: 1988).*
Hori, Semi Conductor Cooler, Feb. 6, 1996, JPH0837261A, Whole Document (Year: 1996).*
(Continued)

*Primary Examiner* — Larry L Furdge
(74) *Attorney, Agent, or Firm* — InventIQ Legal LLP; Steven J. Cahill (57) ABSTRACT

A method is provided for removing heat from an integrated circuit package. Fluid coolant is provided from a fluid inlet of a fluid routing device through channels in the fluid routing device to absorb heat generated by first and second integrated circuit dies in the integrated circuit package. The fluid routing device is mounted on a surface of each of the first and second integrated circuit dies. The fluid coolant is provided from the channels to a fluid outlet of the fluid routing device. A flow of the fluid coolant through the fluid routing device is adjusted to reduce a temperature of the first integrated circuit die in response to an increase in a workload of the first integrated circuit die.

18 Claims, 7 Drawing Sheets

(56) References Cited

U.S. PATENT DOCUMENTS

| | | |
|---|---|---|
| 7,204,298 B2 | 4/2007 | Hodes et al. |
| 7,336,487 B1 | 2/2008 | Chrysler et al. |
| 7,348,665 B2 | 3/2008 | Sauciuc et al. |
| 8,909,383 B2 * | 12/2014 | Hadderman ....... G05D 23/1919 700/299 |
| 2004/0104022 A1 | 6/2004 | Kenny et al. |
| 2006/0033236 A1 | 2/2006 | Brandenburg et al. |
| 2006/0179334 A1 * | 8/2006 | Brittain ................ G06F 1/206 713/320 |
| 2006/0280012 A1 * | 12/2006 | Perner .................. G11C 7/04 365/212 |
| 2007/0034356 A1 * | 2/2007 | Kenny .................. F04B 17/00 165/80.4 |
| 2008/0017367 A1 * | 1/2008 | Yazawa .............. G01R 31/2874 165/287 |
| 2013/0044431 A1 | 2/2013 | Koeneman |
| 2014/0204534 A1 * | 7/2014 | Choudhury ............. G06F 1/206 361/702 |

FOREIGN PATENT DOCUMENTS

| | | | |
|---|---|---|---|
| JP | H0837261 A | * | 2/1996 |
| WO | 2004042303 | | 5/2004 |
| WO | 2014-026205 | | 2/2014 |

OTHER PUBLICATIONS

Korean Intellectual Property Office, International Search Report for international application PCT/US2017/061484, dated Feb. 27, 2018, pp. 1-8.
Korean Intellectual Property Office, Written Opinion of the International Searching Authority for international application, PCT/US2017/061484, dated Feb. 27, 2018, pp. 1-7.
U.S. Appl. No. 15/273,326, filed Sep. 22, 2016.
U.S. Appl. No. 15/274,335, filed Sep. 23, 2016.
European Patent Office, extended European search report for European application 17894231.4, pp. 1-9, dated Sep. 29, 2020.

\* cited by examiner

TECHNIQUES FOR FLUID COOLING OF INTEGRATED CIRCUITS IN PACKAGES

FIELD OF THE DISCLOSURE

The present disclosure relates to integrated circuit packages, and more particularly, to techniques for fluid cooling integrated circuits in packages.

BACKGROUND

In a semiconductor device assembly, multiple integrated circuit (IC) dies may be mounted on a packaging substrate or interposer. As logic and power density of IC dies increase, cooling has become a more significant concern. Conventional cooling techniques, which depend on heat sinks on the backsides of IC dies to transfer heat into streams of forced air, may not be able to meet the needs of power-hungry devices, especially in packages that provide more processing power in less space within IC dies. The power generated during high volume operation by such IC dies may reduce the overall cooling efficiency, and create localized regions of high temperature (i.e., hot spots), which may adversely affect the overall performance and reliability of the IC dies.

BRIEF SUMMARY

According to some embodiments, a method is provided for removing heat from an integrated circuit package. Fluid coolant is provided from a fluid inlet of a fluid routing device through channels in the fluid routing device to absorb heat generated by first and second integrated circuit dies in the integrated circuit package. The fluid routing device is mounted on a surface of each of the first and second integrated circuit dies. The fluid coolant is provided from the channels to a fluid outlet of the fluid routing device. A flow of the fluid coolant through the fluid routing device is adjusted to reduce a temperature of the first integrated circuit die in response to an increase in a workload of the first integrated circuit die.

According to further embodiments, an integrated circuit package includes first and second integrated circuit dies and a fluid routing device mounted on a surface of each of the first and second integrated circuit dies. The fluid routing device includes a first horizontal channel over the first integrated circuit die, first vertical channels that are oriented to provide fluid coolant to and from the first horizontal channel, a second horizontal channel over the second integrated circuit die, second vertical channels that are oriented to provide fluid coolant to and from the second horizontal channel, and a third horizontal channel oriented to provide the fluid coolant from the second vertical channels to a fluid outlet without the fluid coolant from the second vertical channels in the third horizontal channel passing over the first integrated circuit die.

Embodiments of the present invention can be implemented in numerous ways, such as a process, an apparatus, a system, or a device. Several embodiments of the present invention are described below. Various objects, features, and advantages of the present invention will become apparent upon consideration of the following detailed description and the accompanying drawings.

DETAILED DESCRIPTION

As logic density increases in many types of integrated circuit (IC) dies, and memory bandwidth requirements increase substantially, device performance and applications may be thermally limited. Heat removal issues become exacerbated when multiple IC dies are combined in a single IC package. As an example, a programmable logic IC, such as a field programmable gate array (FPGA), may be combined with high bandwidth memory (HBM) integrated circuits in a single package to form a system in a package (SiP). Traditional air and liquid cooling methods may not be able to effectively dissipate heat for high end FPGA ICs, especially in a SiP in which the IC dies are coupled together through an interposer (referred to as a 2.5D package).

According to some embodiments disclosed herein, techniques are provided for cooling multiple integrated circuit (IC) dies in an IC package that increase the bandwidths of the memory IC dies in the package. A fluid routing device is provided in an IC package. Fluid coolant is pumped through channels in the fluid routing device to cool IC dies in the IC package. The channels may, for example, be located in a carrier die or an integrated heat spreader lid. In some embodiments, the geometry of the fluid routing device is modified to provide increased cooling to one or more memory IC dies in the package. For example, the location, density, pitch, or depth of fluid channels in the fluid routing device may be selected to provide cooling to a memory IC die in the package that increases the bandwidth of that memory IC die. As another example, a controller for a fluidic cooling system may control the flow rate, pressure drop, direction, and inlet/outlet ports of the fluid coolant in a fluid routing device in response to (or in anticipation of) an increase in a workload of a memory IC die in an IC package to affect the temperature dependent refresh rate and bandwidth of the memory IC die.

Figure 1:
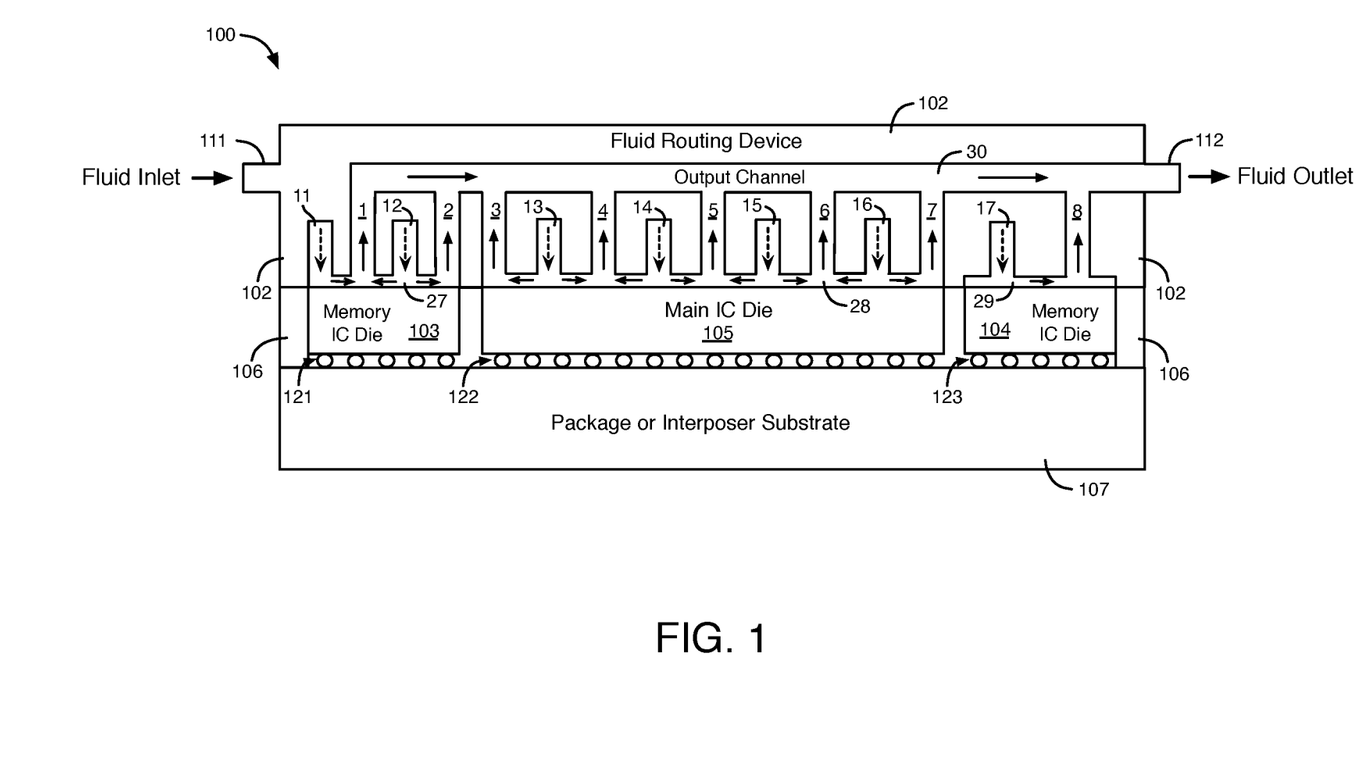
FIG. 1 shows a cross section view of an example of a fluidic cooling system in an integrated circuit package, in accordance with an embodiment.

FIG. 1 shows a cross section view of an example of a fluidic cooling system in an integrated circuit package 100, in accordance with one embodiment of the present invention. The integrated circuit (IC) package 100 of FIG. 1 includes a fluid routing device 102, a main integrated circuit (IC) die 105, memory IC dies 103-104, solder bumps 121-123, mounting support 106, and package or interposer substrate 107. The fluid routing device 102 is mounted directly on top of IC dies 103-105, as shown in FIG. 1, such that fluid coolant in fluid routing device 102 directly contacts the backside surfaces of IC dies 103-105.

The fluid routing device 102 is also mounted directly on top of the mounting support 106 as shown in FIG. 1. Mounting support 106 may enclose IC dies 103-105 on all four of their sides. Mounting support 106 may support fluid routing device 102 on all four of its sides. The main IC die 105 in package 100 may be, for example, a field programmable gate array (FPGA) die, a microprocessor IC die, or another type of IC die. As shown in FIG. 1, IC die 105 is coupled to substrate 107 through solder bumps 122. Memory IC dies 103-104 are coupled to substrate 107 through solder bumps 121 and 123, respectively.

In the embodiment of FIG. 1, the fluid routing device 102 includes a fluid inlet 111, a fluid outlet 112, up vertical fluid channels 1-8, down vertical fluid channels 11-17, and horizontal fluid channels 27-30. A fluid coolant is delivered to fluid routing device 102 through the fluid inlet 111 to remove heat from the IC package 100. In the fluid routing device 102, the up vertical channels 1-8 are interleaved between the down vertical channels 11-17. The fluid coolant can be one or more of many materials capable of absorbing heat from IC package 100, such that heat is removed from IC package 100. For example, the fluid coolant may be deionized water, a mixture of water and anti-freezing solution such as propylene glycol, or refrigerant.

The fluid coolant flows into the fluid routing device 102 through the fluid inlet 111. The fluid coolant then flows from fluid inlet 111 through fluid channels (not shown) in device 102 to fluid channels 11-17. Thus, channels 11-17 are open to the fluid inlet 111. The fluid coolant from inlet 111 then flows vertically down through vertical fluid channels 11-17, as shown by the dotted down arrows in FIG. 1. The fluid coolant flowing down from channels 11-12 flows horizontally through horizontal channel 27 directly over the backside surface of memory IC die 103, as shown by the horizontal arrows in FIG. 1. As the fluid coolant flows over the backside surface of memory IC die 103 in channel 27, the fluid coolant in channel 27 cools IC die 103 by absorbing heat from IC die 103. The warmed fluid coolant in channel 27 then flows vertically up through vertical channels 1-2, as shown by the solid up arrows in FIG. 1.

The fluid coolant flowing down from vertical channels 13-16 flows horizontally through horizontal channel 28 directly over the backside surface of main IC die 105, as shown by the horizontal arrows in FIG. 1. As the fluid coolant flows over the backside surface of main IC die 105 in channel 28, the fluid coolant in channel 28 cools IC die 105 by absorbing heat from IC die 105. The warmed fluid coolant in channel 28 then flows vertically up through vertical channels 3-7, as shown by the solid up arrows in FIG. 1.

The fluid coolant flowing down from vertical channel 17 flows horizontally through horizontal channel 29 directly over the backside surface of memory IC die 104, as shown by the horizontal arrow in FIG. 1. As the fluid coolant flows over the backside surface of memory IC die 104 in channel 29, the fluid coolant in channel 29 cools memory IC die 104 by absorbing heat from memory IC die 104. The warmed fluid coolant in channel 29 then flows vertically up through vertical channel 8, as shown by the solid up arrow in FIG. 1.

The warmed fluid coolant in channels 1-8 then flows horizontally from channels 1-8 through horizontal output channel 30 in device 102 to fluid outlet 112. The warmed fluid coolant then exits the fluid routing device 102 through fluid outlet 112. Channels 1-8 are open to the fluid outlet 112 through channel 30. Thus, the vertical channels 1-8 and 11-17 allow for the flow of fluid coolant downwards to and upwards from, respectively, channels 27-29 and the upper surfaces of IC dies 103-105 in order to remove heat from IC package 100. The fluid coolant typically increases in temperature as it flows through fluid routing device 102 from inlet 111 to outlet 112, thereby removing heat from the IC package 100.

Memory IC dies 103-104 may be, for example, high bandwidth memory (HBM), such as dynamic random access memory (DRAM) IC dies. Many types of IC dies are sensitive to heat. As an example, the refresh rate of the DRAM cells in temperature-compensated refresh DRAM IC dies is increased at higher temperatures, because the leakage currents in semiconductors increase with temperature. In a temperature-compensated refresh DRAM IC, the refresh rate of the DRAM cells increases in response to an increase in the temperature of the DRAM IC, which reduces the bandwidth of the DRAM IC. In a system in package (SiP) that has DRAM IC dies, a reduction in the bandwidth of one or more of the DRAM IC dies in the SiP may adversely impact the performance of the SiP.

In an embodiment, memory IC dies 103-104 are temperature-compensated refresh DRAM ICs that automatically cause the refresh rate of their DRAM cells to increase in response to an increase in their temperatures. In order to prevent or reduce a reduction in the bandwidths of the memory IC dies 103-104 in package 100 at higher temperatures, the vertical fluid channels that route the fluid coolant in fluid routing device 102 are more densely packed together above memory IC die 103 than above main IC die 105.

As shown in FIG. 1, vertical channels 1-2 and 11-12 above IC die 103 are closer together (and thus, have a smaller pitch) than the vertical channels 3-7 and 13-16 above IC die 105. Thus, a greater flow rate of the cool fluid coolant from inlet 111 is provided to the backside surface of memory IC die 103 than to the backside surface of IC die 105. The fluid coolant is provided to IC die 103 before the coolant has been warmed by the IC dies 103-105. As a result, the fluid coolant in device 102 may reduce the temperature of IC 103 more than the fluid coolant in device 102 reduces the temperature of IC die 105. By providing denser vertical fluid channels over IC die 103 that can reduce the temperature of IC die 103 more than the temperature of IC die 105, fluid routing device 102 can increase the bandwidth of IC die 103 or limit any reduction in the bandwidth of IC die 103. Memory IC dies 103-104 may have lower maximum operating temperatures than IC die 105.

Because memory IC die 104 is farther away from inlet 111 and closer to outlet 112, the fluid coolant provided to the backside surface of IC die 104 may be warmed by heat from IC dies 103 and 105. As shown in FIG. 1, vertical channels 3-7 and 13-16 above IC die 105 are closer together (i.e., more densely packed together) than the vertical channels 8 and 17 above IC die 104. The less densely packed vertical channels over IC die 104 provide a smaller flow rate of the warmed fluid coolant to the backside surface of IC die 104 than to the backside surface of IC die 105. The smaller flow rate of the fluid coolant over IC die 104 may reduce the temperature of IC die 104 more than if the vertical channels above IC die 104 were more densely packed together. Thus, the less densely packed vertical channels over IC die 104 may increase the bandwidth of IC die 104 or limit any reduction in the bandwidth of IC die 104.

Figure 2:
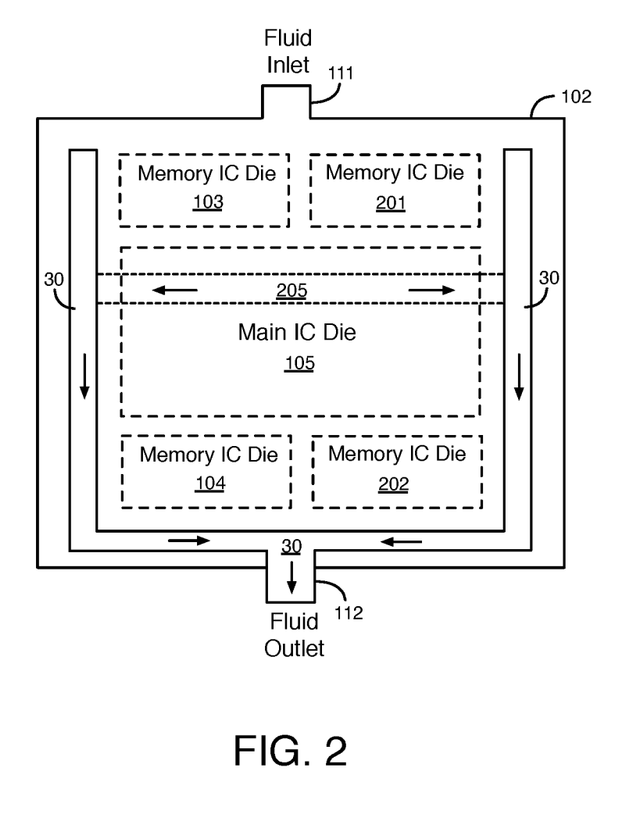
FIG. 2 illustrates an example of a fluid routing device with a horizontal fluid output channel that is routed around memory integrated circuit (IC) dies in an IC package, according to an embodiment.

In some embodiments, an output channel that provides fluid coolant to the fluid outlet of the fluid routing device is routed around memory IC dies in the IC package to reduce the temperature of the memory IC dies. FIG. 2 illustrates an example of fluid routing device 102 with a horizontal fluid output channel 30 that is routed around memory IC dies in IC package 100, according to an embodiment of the present invention. FIG. 2 shows a top down view of the fluid routing device 102 in the IC package 100 of FIG. 1. In the embodiment of FIG. 2, IC package 100 includes four memory IC dies 103-104 and 201-202 and the main IC die 105. The horizontal output fluid channel 30 in fluid routing device 102 is routed around the memory IC dies 103-104 and 201-202, as shown in FIG. 2, such that the warmed fluid coolant does not flow directly over the memory IC dies 103-104 and 201-202.

Fluid channel 30 provides the warmed fluid coolant from up vertical channels 1-8 shown in FIG. 1 (and possibly other up vertical channels) around the memory IC dies 103-104 and 201-202 to the fluid outlet 112, as shown by the arrows in FIG. 2. The warmed fluid coolant may, for example, be provided from channels 1-8 to channel 30 through one or more additional horizontal channels, such as horizontal channel 205 shown in FIG. 2. Because the warmed fluid coolant provided through channel 30 is routed around memory IC dies 103-104 and 201-202 as shown in FIG. 2, rather than directly over the memory IC dies, the temperature of the memory IC dies 103-104 and 201-202 is reduced, and therefore, any reduction in the bandwidths of memory IC dies 103-104 and 201-202 at higher temperatures is limited.

Figure 3:
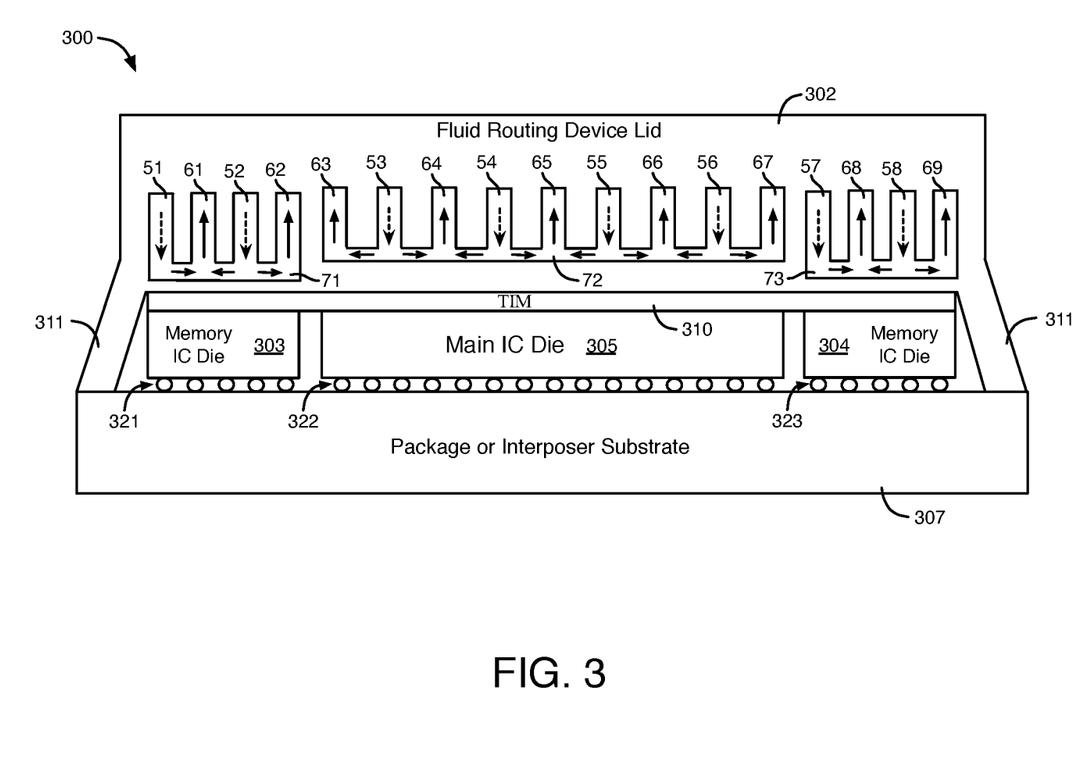
FIG. 3 shows a cross section view of another example of a fluidic cooling system in an integrated circuit (IC) package, in accordance with one embodiment.

FIG. 3 shows a cross section view of another example of a fluidic cooling system in an integrated circuit (IC) package 300, in accordance with one embodiment of the present invention. The integrated circuit (IC) package 300 of FIG. 3 includes a fluid routing device lid 302, integrated circuit (IC) dies 303-305, solder bumps 321-323, thermal interface material (TIM) 310, and package or interposer substrate 307. In the embodiment of FIG. 3, the fluid routing device 302 that provides fluid coolant for cooling IC dies 303-305 is integrated in a package lid. Fluid routing device lid 302 includes mounting support 311 that is mounted on top of substrate 307, as shown in FIG. 3. Mounting support 311 may enclose IC dies 303-305 on all four sides.

Package 300 includes a main IC die 305 and two memory IC dies 303-304. The main IC die 305 may be, for example, a field programmable gate array (FPGA) die, a microprocessor IC die, or another type of IC die. As shown in FIG. 3, IC die 305 is coupled to substrate 307 through solder bumps 322. Memory IC dies 303-304 are coupled to substrate 307 through solder bumps 321 and 323, respectively.

In the embodiment of FIG. 3, the fluid routing device 302 includes up vertical fluid channels 61-69, down vertical fluid channels 51-58, and horizontal fluid channels 71-73. A fluid coolant is delivered to fluid routing device 302 through a fluid inlet (not shown in FIG. 3) to remove heat from the IC package 300. In the fluid routing device 302, the up vertical channels 61-69 are interleaved between the down vertical channels 51-58. The fluid coolant can be one or more of many materials capable of absorbing heat from IC package 300.

The fluid coolant flows into the fluid routing device 302 from the fluid inlet through fluid channels (not shown) in device 302 to down vertical fluid channels 51-58. Thus, channels 51-58 are open to the fluid inlet. The fluid coolant from the fluid inlet then flows vertically down through vertical fluid channels 51-58, as shown by the dotted down arrows in FIG. 3. The fluid coolant flowing from channels 51-52 flows horizontally through channel 71 above the backside surface of memory IC die 303, as shown by the horizontal arrows in FIG. 3, cooling IC die 303 by absorbing heat from IC die 303. The warmed fluid coolant in channel 71 then flows vertically up through vertical channels 61-62, as shown by the solid up arrows in FIG. 3.

The fluid coolant flowing from vertical channels 53-56 flows horizontally through channel 72 above the backside surface of main IC die 305, as shown by the horizontal arrows in FIG. 3, cooling IC die 305 by absorbing heat from IC die 305. The warmed fluid coolant in channel 72 then flows vertically up through vertical channels 63-67, as shown by the solid up arrows in FIG. 3.

The fluid coolant flowing from vertical channels 57-58 flows horizontally through channel 73 above the backside surface of memory IC die 304, as shown by the horizontal arrows in FIG. 3, cooling IC die 304 by absorbing heat from IC die 304. The warmed fluid coolant in channel 73 then flows vertically up through vertical channels 68-69, as shown by the solid up arrows in FIG. 3.

In an embodiment, memory IC dies 303-304 are temperature-compensated refresh DRAM IC dies that cause the refresh rate of their DRAM cells to increase in response to an increase in their temperatures. In order to prevent or limit a reduction in the bandwidths of memory IC dies 303-304 at higher temperatures, the vertical channels 51-52 and 61-62 above IC die 303 and the vertical channels 57-58 and 68-69 above memory IC die 304 are closer together than the vertical channels 53-56 and 63-67 above IC die 305. Because channels 51-52, 61-62, 57-58, and 68-69 have a smaller pitch than channels 53-56 and 63-67, a greater flow rate of cool fluid coolant from the fluid inlet may be provided to cool memory IC dies 303-304 than the flow rate of fluid coolant provided to cool any portion of IC die 305. As a result, the fluid coolant in device 302 may reduce the temperature of IC dies 303-304 more than the fluid coolant in device 302 reduces the temperature of IC die 305. By providing vertical fluid channels over IC dies 303-304 having a smaller pitch that reduce the temperatures of IC dies 303-304, device 302 can prevent or limit any reduction in the bandwidths of memory IC dies 303-304.

As shown in FIG. 3, the distance between horizontal channel 71 and IC die 303 is less than the distance between horizontal channel 72 and IC die 305. Also, the distance between horizontal channel 73 and memory IC die 304 is less than the distance between horizontal channel 72 and IC die 305. Thus, channels 71 and 73 are closer to their respective IC dies 303-304 than channel 72 is to IC die 305. The solid portions of device 302 that are below channels 71 and 73 are thinner than the solid portion of device 302 below channel 72. As a result, the fluid coolant in device 302 may reduce the temperature of IC dies 303-304 more than the fluid coolant in device 302 reduces the temperature of IC die 305. By providing further reductions in the temperatures of IC dies 303-304, fluid routing device 302 can prevent or further limit any reduction in the bandwidths of memory IC dies 303-304.

Figure 4:
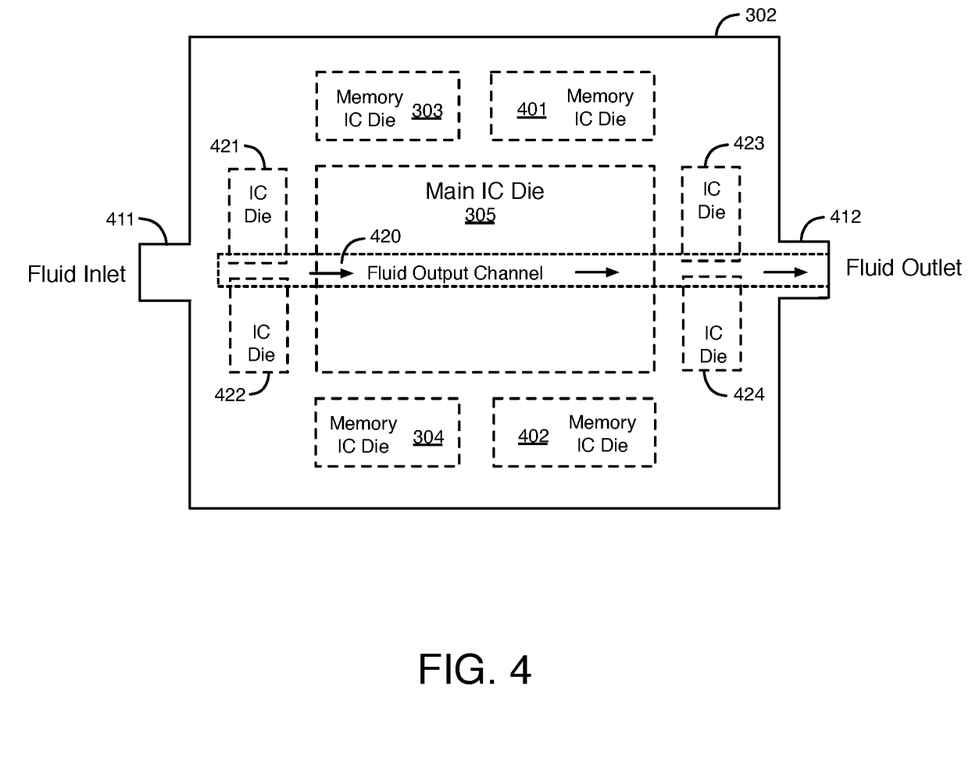
FIG. 4 illustrates an example of the fluid routing device lid of FIG. 3 with a horizontal fluid output channel that is routed around memory IC dies in an IC package, according to an embodiment.

FIG. 4 illustrates an example of the fluid routing device lid 302 of FIG. 3 with a horizontal fluid output channel 420 that is routed between memory IC dies in IC package 300, according to an embodiment of the present invention. FIG. 4 shows a top down view of the fluid routing device lid 302 in the IC package 300 of FIG. 3. In the embodiment of FIG. 4, IC package 300 includes four memory IC dies 303-304 and 401-402, the main IC die 305, and four additional IC dies 421-424. FIG. 4 also shows a fluid inlet 411 and a fluid outlet 412 of device 302. A horizontal fluid output channel 420 in fluid routing device 302 is routed between the memory IC dies 303-304 and 401-402, as shown in FIG. 4, such that the warmed fluid coolant flows to outlet 412 without flowing directly over the memory IC dies 303-304 and 401-402.

Fluid output channel 420 provides the warmed fluid coolant from up vertical channels 61-69 shown in FIG. 3 (and possibly other up vertical channels) between the memory IC dies 303-304 and 401-402 to the fluid outlet 412, as shown by the arrows in FIG. 4. The warmed fluid coolant may, for example, be provided directly from channels 61-69 to channel 420, or via one or more additional fluid channels. Because the warmed fluid coolant provided through channel 420 is routed between memory IC dies 303-304 and 401-402 as shown in FIG. 4, rather than directly over the memory IC dies, the temperatures of the memory IC dies 303-304 and 401-402 are reduced, and therefore, any reduction in the bandwidths of memory IC dies 303-304 and 401-402 is limited or prevented.

The embodiments disclosed herein with respect to FIGS. 1-4 are not mutually exclusive. In some embodiments, the structures shown in two or more of FIGS. 1-4 may be used together in the same integrated circuit package. For example, an IC package may have some horizontal channels that allow the fluid coolant to directly contact an IC die (as shown in FIG. 1) and other channels in which the fluid coolant does not directly contact an IC die (as shown in FIG. 3). As another example, an IC package may include a fluid output channel (such as channel 30) that routes warmed fluid coolant directly to a fluid outlet around the edges of the fluid routing device and another fluid output channel (such as channel 420) that routes warmed fluid coolant directly to a fluid outlet through the center of the fluid routing device.

Figure 5:
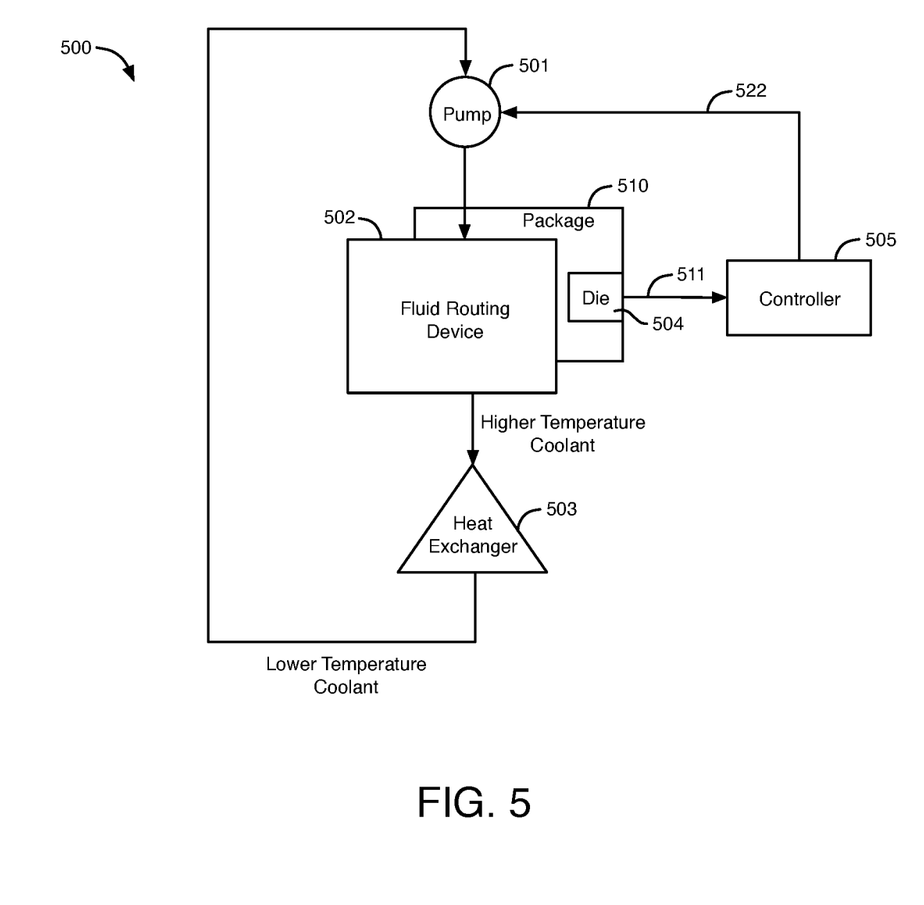
FIG. 5 illustrates an example of a fluid cooling control system for an integrated circuit package, according to an embodiment.

FIG. 5 illustrates an example of a fluid cooling control system 500 for an integrated circuit package, according to an embodiment. The fluid cooling control system 500 of FIG. 5 includes a pump 501, an integrated circuit (IC) package 510, a heat exchanger 503, and a controller 505. IC package 510 includes fluid routing device 502, a memory IC die 504, and other IC dies not shown in FIG. 5. IC package 510 may be, for example, IC package 100 or 300. Fluid routing device 502 may be, for example, fluid routing device 102 or 302. IC die 504 may be, for example, memory IC die 103, 104, 303, or 304.

As discussed above with respect to the previous embodiments, fluid coolant flows through the fluid routing device 502 from the fluid inlet to the fluid outlet. After the fluid coolant exits the fluid outlet of the fluid routing device 502, the fluid coolant is provided to heat exchanger 503. The fluid coolant may give off heat when passing through the heat exchanger 503 and then again be pumped through the fluid routing device 502, forming a closed-loop fluid coolant circulation path.

Information regarding the workload of the memory IC die 504 and other memory IC dies in package 510 is transmitted to controller 505 along signal path 511. The workload information sent through path 511 may indicate, for example, the data rate or bandwidth of data currently being sent to and from the one or more memory IC dies in package 510. Controller 505 monitors the workload (e.g., the bandwidth) of the memory IC dies, including die 504, in package 510 based on the workload information sent through signal path 511. Controller 505 sends instructions to pump 501 through signal path 522 (and/or to the valves of device 502) to adjust the flow of fluid coolant from the pump 501 to the fluid routing device 502 in response to the signals on path 511 indicating that the workload of one or more of the memory IC dies has changed.

For example, controller 505 may send instructions to pump 501 and/or to the valves of the fluid routing device 502 to increase the flow rate or the pressure of the fluid coolant routed to the fluid routing device 502 in response to the signals on path 511 indicating that the memory IC die 504 has a larger workload. Controller 505 may send instructions to pump 501 and/or to the valves of the fluid routing device 502 to decrease the flow rate or the pressure of the fluid coolant routed to the fluid routing device 502 in response to the signals on path 511 indicating that the memory IC die 504 has a smaller workload. System 500 may, for example, reduce the flow rate or pressure of the fluid coolant in device 502 in order to reduce the power consumption of system 500 during periods of low workload.

As another example, controller 505 may send instructions to pump 501 to change the direction of the flow of fluid coolant in device 502 in response to the signals on path 511 indicating that the workload of one or more of the memory IC dies in package 510 has changed. For example, if memory IC die 504 is near a port of fluid routing device 502 that is initially functioning as the fluid outlet, then in response to controller 505 sensing that the workload of IC die 504 has increased above a threshold, controller 505 may send instructions to pump 501 to reverse the flow of the fluid coolant through device 502 to cause the fluid coolant to be pumped into device 502 through the port near IC die 504. As a result, the port previously used as the fluid inlet is now used as a fluid outlet, and the port near IC die 504 is now the fluid inlet.

The memory IC dies in package 510 may be temperature-compensated refresh DRAM IC dies that automatically adjust the refresh rates of their DRAM cells in response to changes in the temperatures of the DRAM IC dies. As discussed above, controller 505 can control the flow rate, pressure drop, direction, and the location of the fluid inlet/outlet ports of the fluid coolant provided through device 502 to adjust the amount of cooling provided to the memory IC dies in package 510 in response to changes in the workload and/or bandwidth of the one or more memory IC dies. The fluid cooling control system 500 can thus reduce the temperatures of the memory IC dies in IC package 510 in order to increase the bandwidth of the memory IC dies through refresh rate reduction. Thus, fluid cooling control system 500 can reduce the temperature dependent refresh rates and increase the bandwidths of the memory IC dies in IC package 510 by adjusting the flow rate, pressure drop, direction, and inlet/outlet ports of the fluid coolant in device 502 to reduce the temperatures of the memory IC dies in package 510.

Figure 6:
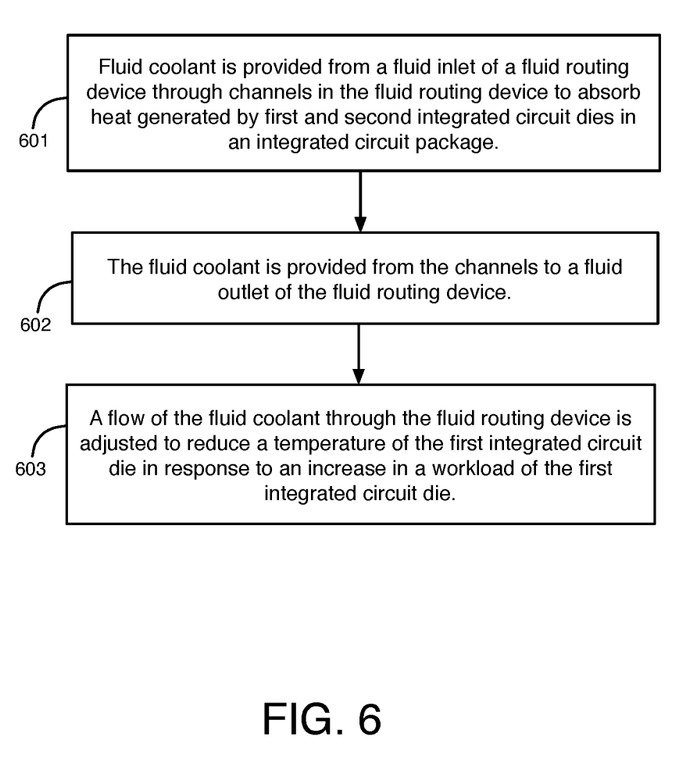
FIG. 6 is a flow chart that illustrates examples of operations for removing heat from an integrated circuit package by adjusting the flow of fluid coolant through a fluid routing device in the integrated circuit package, according to an embodiment.

FIG. 6 is a flow chart that illustrates examples of operations for removing heat from an integrated circuit package by adjusting the flow of fluid coolant through a fluid routing device in the integrated circuit package, according to an embodiment. In operation 601, fluid coolant is provided from a fluid inlet of the fluid routing device through channels in the fluid routing device to absorb heat generated by first and second integrated circuit dies in the integrated circuit package. The fluid routing device is mounted on a surface of each of the first and second integrated circuit dies. In operation 602, the fluid coolant is provided from the channels to a fluid outlet of the fluid routing device. In operation 603, a flow of the fluid coolant through the fluid routing device is adjusted to reduce a temperature of the first integrated circuit die in response to an increase in a workload of the first integrated circuit die.

Figure 7:
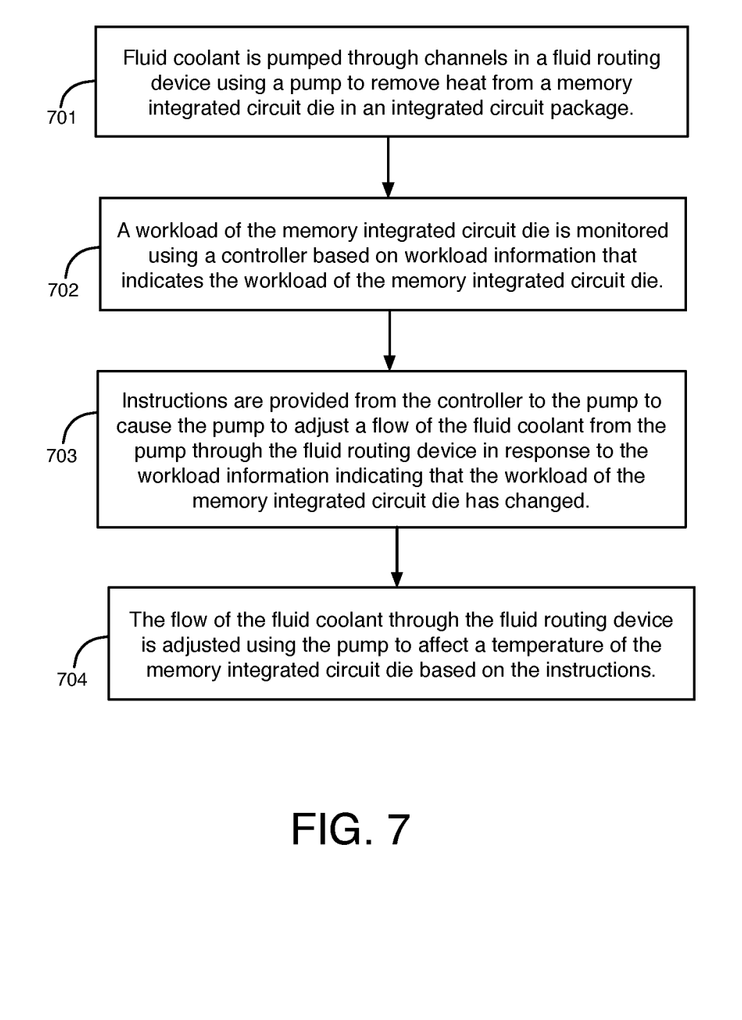
FIG. 7 is a flow chart that illustrates examples of operations for cooling a memory integrated circuit die in an integrated circuit package, according to an embodiment.

FIG. 7 is a flow chart that illustrates examples of operations for cooling a memory integrated circuit die in an integrated circuit package, according to an embodiment. In operation 701, fluid coolant is pumped through channels in a fluid routing device using a pump to remove heat from the memory integrated circuit die in the integrated circuit package. In operation 702, a workload of the memory integrated circuit die is monitored using a controller based on workload information that indicates the workload of the memory integrated circuit die. In operation 703, instructions are provided from the controller to the pump to cause the pump to adjust a flow of the fluid coolant from the pump through the fluid routing device in response to the workload information indicating that the workload of the memory integrated circuit die has changed. In operation 704, the flow of the fluid coolant through the fluid routing device is adjusted using the pump to affect a temperature of the memory integrated circuit die based on the instructions.

Although the method operations were described in a specific order, it should be understood that other operations may be performed in between described operations, described operations may be adjusted so that they occur at slightly different times or in a different order, or described operations may be distributed in a system that allows the occurrence of the operations at various intervals associated with the processing.

In the previous description, for the purpose of explanation, numerous specific details have been set forth in order to provide a thorough understanding of the present invention. However, the present invention may be practiced without all of these specific details. The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A method for removing heat from an integrated circuit package, the method comprising:
   providing fluid coolant from a fluid inlet of a fluid routing device through first vertical channels in the fluid routing device and then through a first horizontal channel in the fluid routing device to absorb heat generated by a first integrated circuit die in the integrated circuit package, wherein the first horizontal channel is over the first integrated circuit die, and wherein the fluid coolant from the first vertical channels flows horizontally through the first horizontal channel directly over a surface of the first integrated circuit die;
   providing the fluid coolant from the first horizontal channel through second vertical channels in the fluid routing device to a second horizontal channel in the fluid routing device;
   providing the fluid coolant from the fluid inlet through third vertical channels in the fluid routing device and then through a third horizontal channel in the fluid routing device to absorb heat generated by a second integrated circuit die in the integrated circuit package, wherein the third horizontal channel is over the second integrated circuit die;
   providing the fluid coolant from the third horizontal channel through fourth vertical channels in the fluid routing device to the second horizontal channel without causing the fluid coolant from the third horizontal channel to flow through the first horizontal channel; and
   providing the fluid coolant from the second horizontal channel to a fluid outlet of the fluid routing device.

2. The method of claim 1 further comprising:
   adjusting a flow of the fluid coolant through the fluid routing device to reduce a temperature of the first integrated circuit die in response to signals sent through a signal path from the first integrated circuit die and received at a controller that indicate an increase in a data rate of data being sent to and from the first integrated circuit die.

3. The method of claim 2, wherein adjusting the flow of the fluid coolant through the fluid routing device to reduce the temperature of the first integrated circuit die in response to the signals sent through the signal path from the first integrated circuit die and received at the controller that indicate an increase in the data rate of the data being sent to and from the first integrated circuit die further comprises:
   adjusting a flow rate or pressure of the fluid coolant provided through the fluid routing device using a pump in response to an increase in the data rate of the data being sent to and from the first integrated circuit die.

4. The method of claim 2, wherein adjusting the flow of the fluid coolant through the fluid routing device to reduce the temperature of the first integrated circuit die in response to the signals sent through the signal path from the first integrated circuit die and received at the controller that indicate an increase in the data rate of the data being sent to and from the first integrated circuit die further comprises:
   changing a direction of the flow of the fluid coolant through the fluid routing device using a pump in response to an increase in the data rate of the data being sent to and from the first integrated circuit die to cause a port of the fluid routing device previously used as the fluid outlet to be used as the fluid inlet for the fluid coolant.

5. The method of claim 4, wherein the direction of the flow of the fluid coolant through the fluid routing device is changed in response to the controller receiving an indication that the data rate of the data being sent to and from the first integrated circuit die has increased above a threshold, and wherein the first integrated circuit die is adjacent to the port.

6. The method of claim 2, wherein the first integrated circuit die is a memory integrated circuit die, and wherein the controller monitors a bandwidth of the memory integrated circuit die based on the data rate of the data as indicated by the signals sent through the signal path.

7. The method of claim 2, wherein adjusting the flow of the fluid coolant through the fluid routing device to reduce the temperature of the first integrated circuit die further comprises adjusting the flow of the fluid coolant through the fluid routing device to reduce the temperature of the first integrated circuit die in response to the signals sent through the signal path from the first integrated circuit die without using a temperature sensor that senses a temperature of the first integrated circuit die.

8. The method of claim 1, wherein the second horizontal channel is oriented to provide the fluid coolant to the fluid outlet without the fluid coolant in the second horizontal channel flowing directly over the first integrated circuit die or the second integrated circuit die.

9. The method of claim 1, wherein the fluid coolant from the third vertical channels flows horizontally through the third horizontal channel directly over a surface of the second integrated circuit die.

10. A method for cooling a memory integrated circuit die and a second integrated circuit die in an integrated circuit package, the method comprising:

provided fluid coolant from a fluid inlet of a fluid routing device through first vertical channels in the fluid routing device and then through a first horizontal channel in the fluid routing device to absorb heat from the memory integrated circuit die in the integrated circuit package, wherein the first horizontal channel is above the memory integrated circuit die, and wherein the fluid coolant from the first vertical channels flows horizontally through the first horizontal channel directly over a surface of the memory integrated circuit die;

providing the fluid coolant from the first horizontal channel through second vertical channels in the fluid routing device to a second horizontal channel in the fluid routing device;

providing the fluid coolant from the fluid inlet through third vertical channels in the fluid routing device and then through a third horizontal channel in the fluid routing device to absorb heat from the second integrated circuit die in the integrated circuit package, wherein the third horizontal channel is above the second integrated circuit die;

providing the fluid coolant from the third horizontal channel through fourth vertical channels in the fluid routing device to the second horizontal channel without allowing the fluid coolant from the third horizontal channel to flow through the first horizontal channel; and providing the fluid coolant through the second horizontal channel to a fluid outlet of the fluid routing device.

11. The method of claim 10 further comprising:

adjusting the flow of the fluid coolant through the fluid routing device using a pump by adjusting a flow rate or pressure of the fluid coolant provided to the fluid routing device using the pump.

12. The method of claim 11, wherein adjusting a flow rate or pressure of the fluid coolant provided to the fluid routing device using the pump further comprises:

decreasing the flow rate or the pressure of the fluid coolant in the fluid routing device in response to signals indicating that a data rate of data being sent to and from the memory integrated circuit die has decreased.

13. The method of claim 11, wherein adjusting a flow rate or pressure of the fluid coolant provided to the fluid routing device using the pump further comprises:

increasing the flow rate or the pressure of the fluid coolant in the fluid routing device in response to signals indicating that a data rate of data being sent to and from the memory integrated circuit die has increased.

14. The method of claim 10 further comprising:

adjusting the flow of the fluid coolant through the fluid routing device using a pump by changing a direction of the flow of the fluid coolant in the fluid routing device in response to signals indicating that a data rate of data being sent to and from the memory integrated circuit die has changed to cause a port of the fluid routing device previously used as the fluid outlet to be used as the fluid inlet for the fluid coolant.

15. The method of claim 14, wherein the direction of the flow of the fluid coolant in the fluid routing device is changed in response to a controller receiving an indication that the data rate of the data being sent to and from the memory integrated circuit die has increased above a threshold.

16. The method of claim 10 further comprising:

adjusting the flow of the fluid coolant through the fluid routing device using a pump to affect a temperature of the memory integrated circuit die by adjusting the flow of the fluid coolant through the fluid routing device using the pump to reduce the temperature of the memory integrated circuit die to cause a bandwidth of the memory integrated circuit die to increase through reduction of a refresh rate of dynamic access memory cells in the memory integrated circuit die.

17. The method of claim 10 further comprising:

monitoring a workload of the memory integrated circuit die using a controller based on signals sent through a signal path from the memory integrated circuit die and received at the controller that indicate a data rate of a data being sent to and from the memory integrated circuit die.

18. The method of claim 17, wherein the integrated circuit package further comprises an additional memory integrated circuit die, and wherein the method further comprises providing instructions from the controller to a pump to cause the pump to adjust the flow of the fluid coolant from the pump through the fluid routing device in response to the signals indicating that the data rate of the data being sent to and from the memory integrated circuit die and the additional memory integrated circuit die has changed.

* * * * *